(12) United States Patent
Saxler

(10) Patent No.: US 7,479,669 B2
(45) Date of Patent: Jan. 20, 2009

(54) CURRENT APERTURE TRANSISTORS AND METHODS OF FABRICATING SAME

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/871,790

(22) Filed: Oct. 12, 2007

(65) Prior Publication Data
US 2008/0029789 A1  Feb. 7, 2008

Related U.S. Application Data

(62) Division of application No. 11/436,745, filed on May 18, 2006, now abandoned.

(51) Int. Cl.
*H01L 29/768* (2006.01)
(52) U.S. Cl. ............. 257/242; 257/218; 257/221; 257/240; 257/E29.246; 438/22
(58) Field of Classification Search ............... 438/22; 257/83, 194, 218, 219, 221, 240, 242, E29.246
See application file for complete search history.

(56) References Cited

U.S. PATENT DOCUMENTS

| | | | |
|---|---|---|---|
| 4,424,525 A | 1/1984 | Mimura | |
| 4,471,366 A | 9/1984 | Delagebeaudeuf et al. | |
| 4,727,403 A | 2/1988 | Hilda et al. | |
| 4,755,867 A | 7/1988 | Cheng | |
| 4,788,156 A | 11/1988 | Stoneham et al. | |
| 4,916,498 A | 4/1990 | Berenz | |
| 4,946,547 A | 8/1990 | Palmour et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |

(Continued)

FOREIGN PATENT DOCUMENTS

EP  0 334 006 A1  9/1989

(Continued)

OTHER PUBLICATIONS

Ambacher et al., "Two Dimensional Electron Gases Induced by Spontaneous and Piezoelectric Polarization Charges in N- Ga-face AlGaN/GaN Heterostructures," *Journal of Applied Physics*. vol. 85, No. 6, pp. 3222-3233 (Mar. 1999).

(Continued)

*Primary Examiner*—Howard Weiss
*Assistant Examiner*—John C Ingham
(74) *Attorney, Agent, or Firm*—Myers Bigel Sibley & Sajovec

(57) ABSTRACT

Transistors and/or methods of fabricating transistors that include a source contact, drain contact and gate contact are provided. In some embodiments, a channel region is provided between the source and drain contacts and at least a portion of the channel regions includes a hybrid layer comprising semiconductor material. In particular embodiments of the present invention, the transistor is a current aperture transistor. The channel region may include pendeo-epitaxial layers or epitaxial laterally overgrown layers. Transistors and methods of fabricating current aperture transistors that include a trench that extends through the channel and barrier layers and includes semiconductor material therein are also provided.

16 Claims, 8 Drawing Sheets

U.S. PATENT DOCUMENTS

| | | |
|---|---|---|
| 5,292,501 A | 3/1994 | Degenhardt et al. |
| 5,296,395 A | 3/1994 | Khan et al. |
| 5,298,445 A | 3/1994 | Asano |
| RE34,861 E | 2/1995 | Davis et al. |
| 5,389,571 A | 2/1995 | Takeuchi et al. |
| 5,393,993 A | 2/1995 | Edmond et al. |
| 5,523,589 A | 6/1996 | Edmond et al. |
| 5,534,462 A | 7/1996 | Fiordalice et al. |
| 5,592,501 A | 1/1997 | Edmond et al. |
| 5,686,737 A | 11/1997 | Allen |
| 5,700,714 A | 12/1997 | Ogilhara et al. |
| 5,701,019 A | 12/1997 | Matsumoto et al. |
| 5,705,827 A | 1/1998 | Baba et al. |
| 5,804,482 A | 9/1998 | Konstantinov et al. |
| 5,831,295 A | 11/1998 | Huang et al. |
| 5,885,860 A | 3/1999 | Weitzel et al. |
| 5,946,547 A | 8/1999 | Kim et al. |
| 5,990,531 A | 11/1999 | Taskar et al. |
| 6,028,328 A | 2/2000 | Riechert et al. |
| 6,046,464 A | 4/2000 | Schetzina |
| 6,051,849 A | 4/2000 | Davis et al. |
| 6,064,082 A | 5/2000 | Kawai et al. |
| 6,086,673 A | 7/2000 | Molnar |
| 6,150,680 A | 11/2000 | Eastman et al. |
| 6,177,685 B1 | 1/2001 | Teraguchi et al. |
| 6,177,688 B1 | 1/2001 | Linthicum et al. |
| 6,218,680 B1 | 4/2001 | Carter, Jr. et al. |
| 6,255,198 B1 | 7/2001 | Linthicum et al. |
| 6,261,929 B1 | 7/2001 | Gehrke et al. |
| 6,316,793 B1 | 11/2001 | Sheppard |
| 6,376,339 B2 | 4/2002 | Linthicum et al. |
| 6,380,108 B1 | 4/2002 | Linthicum et al. |
| 6,429,467 B1 | 8/2002 | Ando |
| 6,448,648 B1 | 9/2002 | Boos |
| 6,462,355 B1 | 10/2002 | Linthicum et al. |
| 6,486,042 B2 | 11/2002 | Gehrke et al. |
| 6,489,221 B2 | 12/2002 | Gehrke et al. |
| 6,492,669 B2 | 12/2002 | Nakayama et al. |
| 6,515,316 B1 | 2/2003 | Wojtowicz et al. |
| 6,521,514 B1 | 2/2003 | Gehrke et al. |
| 6,545,300 B2 | 4/2003 | Gehrke et al. |
| 6,548,333 B2 | 4/2003 | Smith |
| 6,570,192 B1 | 5/2003 | Davis et al. |
| 6,582,906 B1 | 6/2003 | Cao et al. |
| 6,582,986 B2 | 6/2003 | Kong et al. |
| 6,586,778 B2 | 7/2003 | Linthicum et al. |
| 6,586,781 B2 | 7/2003 | Wu et al. |
| 6,602,763 B2 | 8/2003 | Davis et al. |
| 6,602,764 B2 | 8/2003 | Linthicum et al. |
| 6,608,327 B1 | 8/2003 | Davis et al. |
| 6,621,148 B2 | 9/2003 | Linthicum et al. |
| 6,639,255 B2 | 10/2003 | Inoue et al. |
| 6,686,261 B2 | 2/2004 | Gehrke et al. |
| 6,706,114 B2 | 3/2004 | Mueller |
| 2001/0015446 A1 | 8/2001 | Inoue et al. |
| 2001/0020700 A1 | 9/2001 | Inoue et al. |
| 2001/0023964 A1 | 9/2001 | Wu et al. |
| 2001/0040246 A1 | 11/2001 | Ishii |
| 2002/0008241 A1 | 1/2002 | Edmond et al. |
| 2002/0017696 A1 | 2/2002 | Nakayama et al. |
| 2002/0066908 A1 | 6/2002 | Smith |
| 2002/0079508 A1 | 6/2002 | Yoshida |
| 2002/0119610 A1 | 8/2002 | Nishii et al. |
| 2002/0167023 A1 | 11/2002 | Chavarkar et al. |
| 2003/0017683 A1 | 1/2003 | Emrick et al. |
| 2003/0020092 A1 | 1/2003 | Parikh et al. |
| 2003/0089930 A1 | 5/2003 | Zhao |
| 2003/0102482 A1 | 6/2003 | Saxler |
| 2003/0123829 A1 | 7/2003 | Taylor |
| 2003/0145784 A1 | 8/2003 | Thompson et al. |
| 2003/0157776 A1 | 8/2003 | Smith |
| 2003/0213975 A1 | 11/2003 | Hirose et al. |
| 2004/0004223 A1 | 1/2004 | Nagahama et al. |
| 2004/0021152 A1 | 2/2004 | Nguyen et al. |
| 2004/0029330 A1 | 2/2004 | Hussain et al. |
| 2004/0061129 A1 | 4/2004 | Saxler et al. |
| 2004/0241970 A1 | 12/2004 | Ring |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |

OTHER PUBLICATIONS

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Exitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadei et al., "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on n-GaN Using Si Implantation," *Applied Physics Letters*. vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "Cl2 reactive ion etching for gate recessing of AlGaN/GaN field-effect transistors," *J. Vac. Sci. Technol. B*. vol. 17, No. 6, pp. 2755-2758 (1999).

Chini et al., "Power and Linearity Characteristics of Field-Plagted Recessed-Gate AlGaN-GaN HEMT," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778 (1994).

Coffie et al., Unpassivated p-GaN/AlGaN/GaN HEMTs with 7.1 W/MMF at 10 GHz, *Electronic Letters online No. 20030872*, 39(19), (Sep. 18, 2003).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate ALGaN/GaN MODFET on Sapphire Grown by MOCVD," *Applied Physics Letters*. vol. 76, No. 1, pp. 121-123 (Jan. 2000).

Gaska et al. "High-Temperature Performance of AlGaN/GaN HFET's on SiC Substrates," *IEEE Electron Device Letters*. vol. 18, No. 1, pp. 492-494 (Oct. 1997).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al., "Self-Heating in High-Power AlGaN/GaN HFET's," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Gradecak, "Microscopic Evidence of Point Defect Incorporation in Laterally Overgraon GaN," *Applied Physics Letters*. vol. 80, No. 16, pp. 2866-2868 (2002).

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, Sten J. *MOCVD Growth Technologies for Applications in AlGaN/GaN High Electron Mobility Transistors*, Dissertation, University of California—Santa Barbara, Sep. 2002, 190 pages.

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultravilet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kashahara et al., "Ka-ban 2.3W Power AlGaN/GaN Heterojunction FET," *IEDM Technical Digest*, pp. 677-680 (2002).

Kaschner et al., Micro-Raman and Cathodoluminescense Studies of Expitaxial Laterally Overgrown GaN with Tungsten Masks: A Method to Map the Free-Carrier Concentration of Thick GaN Samples, *Applied Physics Letters*. vol. 76, No. 23, pp. 3418-3420 (2000).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 cm$^2$/V s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, 7th Wide-Gandgap III-Nitride Workshop (Mar. 2002).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Saxler et al., "III-Nitride Heterostructures on High-Purity Semi-Insulating 4H-SiC Substrates for High-Power RF Transistors," International Workshop on Nitride Semiconductors (Jul. 19, 2004).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Samoff Symposium*, Pittsburgh, PA, Mar. 18, 1998.

Sullivan et al. "High-Power 10-GHz Operation of AlGaN HFET's on Insulating SiC," *IEEE Electron Device Letters*. vol. 19, No. 6, pp. 198-200 (Jun. 1998).

"Thick AlN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

Wagner et al. "Influence of the Carrier Gas Composition on Morphology, Dislocations, and Microscopic Luminescence Properties of Selectively Grown GaN by Hydride Vapor Phase Epitaxy,"0 *Journal of Applied Physics*. vol. 92, No. 3, pp. 1307-1316 (2002).

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al. "30-W/mm GaN HEMTs by Field Plate Optimization," *IEEE Electron Device Letters*. vol. 25, No. 3, pp. 117-119 (Mar. 2004).

Wu et al., "Bias-dependent Performance on High-Power AlGaN/GaN HEMTs," *IEDM Technical Digest*, p. 378-380 (2001).

Wu et al. "High Al-Content AlGaN/GaN MODFET's for Ultrahigh Performance," *IEEE Electron Device Letters*. vol. 19, No. 2, pp. 50-53 (Feb. 1998).

Wu et al., "Linearity Performance of GaN HEMTs With Field Plates," DRC 2004, Cree, Inc.

Yu et al. "Schottky barrier engineering in III-V nitrides via the piezoelectric effect," *Applied Physics Letters*. vol. 73, No. 13, pp. 1880-1882, (Sep. 1998).

Zhang et al., "High Breakdown GaN HEMT with Overlapping Gate Structure," *IEEE Electron Device Letters*, 21(9), pp. 421-423 (Sep. 2000).

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Improved Dielectric Passivation for Semiconductor Devices," U.S. Appl. No. 10/851,507, filed May 22, 2004.

United States Patent Application entitled "Nitride-Based Transisors with a Protective Layer and a Low-Damage Recess and Methods of Fabrication Thereof," U.S. Appl. No. 10/758,871, filed Jan. 16, 2004.

United States Patent Application entitled "Co-Doping for Fermi Level Control in Semi-Insulating Group III Nitrides," filed Jan. 7, 2004.

United States Patent Application entitled "Methods of Having Laterally Grown Active Region and Methods of Fabricating Same," filed, Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Nitride Heterojunction Transistors Having Charge-Transfer Induced Energy Barriers and Methods of Fabricating the Same," U.S. Appl. No. 10/722,882, filed Feb. 5, 2004.

United States Patent Application entitled "Methods of Fabricating Nitride-Based Transistors with a Cap Layer and a Recessed Gate," filed Jul. 23, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118/675, filed Apr. 29, 2005.

United States Patent Application entitled "Composite Substrates of Conductive And Insulating or Semi-Insulating Group III-Nitrides For Group III-Nitride Devices," U.S. Appl. No. 11/103,127, filed Apr. 11, 2005.

United States Patent Application entitled "Thick Semi-Insulating or Insulating Expitaxial Gallium Nitride Layers and Devices Incorporating Same," U.S. Appl. No. 11/103,117, filed Apr. 11, 2005.

United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.

Heikman, et al. "Mass Transport Regrowth of GaN for Ohmic Contacts to AlGaN/GaN," Applied Physics Letters, vol. 78, No. 19, pp. 2876, May 7, 2001.

Parikh et al., "Development of Gallium Nitride Epitaxy and Associated Material Device Correlation for RF, Microwave and MM-wave Applications, " Cree, Inc. (35 slides), May 12, 2004.

Wu et al., "3.5-Watt AlGaN/GaN HEMTs and Amplifiers at 35 $GH_z$ ," Cree Santa Barbara Technology Center, Goleta, CA 93117, Dec. 8, 2003.

Wu et al., "Linearity Performance of GaN HEMTs with Field Plates, " Cree Santa Barbara Technology Center, Goleta, CA 93117, Jun. 21, 2004.

CURRENT APERTURE TRANSISTORS AND METHODS OF FABRICATING SAME

CLAIM OF PRIORITY

This application is a divisional of U.S. patent application Ser. No. 11/436,745, filed May 18, 2006 now abandoned, which claims priority to U.S. patent application Ser. No. 10/849,589, now U.S. Pat. No. 7,084,441, filed May 20, 2004, the disclosures of which are incorporated herein in their entirety by reference.

FIELD OF THE INVENTION

The present invention relates to semiconductor devices and, more particularly, to current aperture transistors.

BACKGROUND

In high voltage/high power electronic devices, a performance characteristic of importance may be the breakdown characteristics of the device. For example, the maximum reverse bias blocking voltage sustainable by the device may limit the potential applications for the device. In conventional transistors, the structure of the device may result in a breakdown voltage that is less than the breakdown voltage of the device. For example, in a conventional U-metal oxide semiconductor field effect transistor (UMOSFET), field crowding may result at a corner of the gate trench such that breakdown occurs in the region of the field crowding rather than in the bulk material. Various structures have been proposed in different types of transistors to provide breakdown voltages of the transistors that approach the bulk breakdown voltage of the materials used in the transistors.

Current aperture transistors have been proposed as a potential approach to achieve near bulk breakdown limits in nitride-based devices. FIG. 1 illustrates a conventional current aperture transistor 10. As seen in FIG. 1, the current aperture transistor 10 includes a silicon doped GaN drain layer 12 with spaced apart regions of insulating GaN 14 that form the current aperture region 30. The current aperture region 30 is part of a regrown unintentionally doped GaN layer 16 that has an AlGaN layer 18 formed thereon so that a two-dimensional electron gas (2DEG) forms at the interface between the unintentionally doped GaN layer 16 and the AlGaN layer 18. A gate contact 24 and a source contact 22 are provided on the AlGaN layer 18 and a drain contact 26 is provided on the silicon doped GaN layer 12.

In operation, electrons from the source contact 22 flow along the 2DEG and through the current aperture 30 to the drain contact 26. The Schottky gate contact 24 modulates the charge in the 2DEG to control the flow of current through the aperture. Because the pinched off region is located beneath the gate, substantial charge does not accumulate at the gate edge. Thus, the high field region may be buried in the bulk material. Further details on current aperture transistors may be found in Ben-Yaacov et al., "AlGaN/GaN current aperture vertical electron transistors with regrown channels", Journal of Applied Physics, Vol. 95, No. 4, 15 Feb. 2004, pp. 2073-78.

SUMMARY OF THE INVENTION

Some embodiments of the present invention provide transistors and/or methods of fabrication of transistors that include a source contact, drain contact and gate contact. A channel region is provided between the source and drain contacts and at least a portion of the channel regions includes a hybrid layer of semiconductor material. In particular embodiments of the present invention, the transistor is a current aperture transistor.

In further embodiments of the present invention, the hybrid layer of semiconductor material includes a Group III-nitride semiconductor material. The hybrid layer of semiconductor material may also include a region of p-type or insulating semiconductor material and a region of n-type semiconductor material. A portion of the channel region through the current aperture may include a vertical portion and a horizontal portion. The hybrid layer may include a pendeo-epitaxial layer having a higher doping level in the laterally grown portions of the pendeo-epitaxial layer. The hybrid layer may include a epitaxial laterally overgrown layer having a higher doping level in the laterally grown portions of the epitaxial laterally overgrown layer.

In additional embodiments of the present invention, the transistor includes a first n-type nitride-based layer on a substrate. The first n-type nitride-based layer has a first surface opposite the substrate and an aperture having sidewalls. A nitride-based layer is provided on the first n-type nitride-based layer and extends onto the sidewalls of the aperture. A portion of the nitride-based layer on the sidewalls of the aperture is n-type and a portion of the nitride-based layer on the first surface of the second n-type nitride-based layer is p-type and/or insulating. An unintentionally doped nitride-based layer is provided on the nitride-based layer and extends to substantially fill the aperture. The unintentionally doped nitride-based layer has portions of n-type nitride-based semiconductor material on the n-type portions of the nitride-based layer. First and second layers of nitride-based semiconductor material are provided on the unintentionally doped nitride-based layer and are configured to provide a two-dimensional electron gas (2DEG) in a region of an interface between the first and second semiconductor material layers. The source contact and the gate contact are provided on the second layer of nitride-based semiconductor material and the drain contact is electrically connected to the first n-type nitride-based layer.

In additional embodiments of the present invention, a second n-type nitride-based layer is provided between the first n-type nitride-based layer and the substrate.

In still further embodiments of the present invention, the substrate has a trench formed therein and the first n-type nitride-based layer, the nitride based layer and the unintentionally doped nitride-based layer are cantilevered over the trench.

In other embodiments of the present invention, a mask region is provided on the substrate or the second n-type nitride-based layer if present and a portion of the first n-type nitride-based layer, the nitride based layer and the unintentionally doped nitride-based layer extend onto the mask region.

Additional embodiments of the present invention include a third n-type nitride-based layer between the second nitride-based layer and the substrate. The substrate may be a silicon carbide substrate and the drain contact may be provided on the substrate opposite the first n-type nitride-based layer. An insulating layer may also be provided between the gate contact and the second layer.

In some embodiments of the present invention, the first n-type nitride-based layer includes a GaN based layer, the second n-type nitride-based layer includes a GaN based layer, the nitride-based layer on the second n-type nitride-based layer includes a GaN based layer, the unintentionally doped nitride-based layer includes a GaN based layer, the first layer includes an unintentionally doped GaN based layer and the second layer includes an AlGaN and/or InAlN based layer. The substrate may also be a GaN substrate.

In still further embodiments of the present invention, transistors and/or methods of fabricating transistors that include a substrate having a trench therein and a first pendeo-epitaxial layer of semiconductor material of the first conductivity type is provided on the substrate is provided. The first pendeo-epitaxial layer has spaced apart cantilevered portions that extend over the trench. A second pendeo-epitaxial layer of semiconductor material of a second conductivity type and/or insulating is provided on the first pendeo-epitaxial layer of semiconductor material and includes spaced apart portions that extend from end surfaces of the cantilevered portions of the first pendeo-epitaxial layer that are the first conductivity type. A third pendeo-epitaxial layer of unintentionally doped semiconductor material is provided on the second pendeo-epitaxial layer and includes portions that extend from the spaced apart portions and coalesce and are the first conductivity type. A channel layer of semiconductor material is provided on the third pendeo-epitaxial layer and a barrier layer is provided on the channel layer. A source contact and a gate contact are provided on the barrier layer. A drain contact is electrically connected to the first layer of conformal semiconductor material.

In additional embodiments of the present invention, a first layer of conformal semiconductor material of a first conductivity type is provided on the substrate and the trench. The first pendeo-epitaxial layer may be provided on the first layer.

In further embodiments of the present invention, the first conductivity type is n-type and the second conductivity type is p-type. The semiconductor material may include a nitride-based semiconductor material. The substrate may be a GaN substrate. The substrate may also be silicon carbide. The silicon carbide substrate may be the first conductivity type and the drain contact may be provided on the silicon carbide substrate. The nitride-based semiconductor material may include a GaN based semiconductor material.

In yet further embodiments of the present invention, transistors and methods of fabricating transistors that include a mask region on a substrate are provided. A first epitaxial laterally overgrown layer of semiconductor material of the first conductivity type is provided on the substrate and at least a portion of the mask region. A second epitaxial laterally overgrown layer of semiconductor material of a second conductivity type and/or insulating is provided on the first epitaxial laterally overgrown layer of semiconductor material and at least a portion of the mask region and includes spaced apart portions that extend from end surfaces of the portions of the first epitaxial laterally overgrown layer on the mask region that are the first conductivity type. A third epitaxial laterally overgrown layer of unintentionally doped semiconductor material is provided on the second epitaxial laterally overgrown layer and includes portions that extend from the spaced apart portions and coalesce and are the first conductivity type. A channel layer of semiconductor material is provided on the third epitaxial laterally overgrown layer. A barrier layer is provided on the channel layer. A source contact and a gate contact are provided on the barrier layer. A drain contact is electrically connected to the first layer of semiconductor material.

In further embodiments of the present invention, a first layer of semiconductor material of a first conductivity type is provided between the substrate and the first epitaxial laterally overgrown layer. The mask region may be provided on the first layer.

In additional embodiments of the present invention, the first conductivity type is n-type and the second conductivity type is p-type. The semiconductor material may be a nitride-based semiconductor material. The substrate may be silicon carbide and/or GaN. The silicon carbide substrate may be the first conductivity type and the drain contact may be provided on the silicon carbide substrate. The nitride-based semiconductor material may be a GaN based semiconductor material.

Still further embodiments of the present invention provided current aperture transistors and methods of fabricating current aperture transistors that include a first layer of semiconductor material of a second conductivity type or insulating on a substrate. A channel layer of semiconductor material is provided on the second layer. A barrier layer is provided on the channel layer. A trench extends through the barrier layer, the channel layer and the first layer. The trench includes semiconductor material of the first conductivity type therein. A gate contact and a source contact are provided on the barrier layer. The source contact is on the barrier layer and opposite the trench from the gate contact. A drain contact is electrically connected to the first layer.

In additional embodiments of the present invention, a second layer of semiconductor material of a first conductivity type is provided between the substrate and the first layer of semiconductor material. In such embodiments, the trench may extend through the first layer to and/or into the second layer.

In some embodiments of the present invention, the first conductivity type is n-type and the second conductivity type is p-type. The semiconductor material may be a nitride-based semiconductor material. The substrate may be GaN. The substrate may also be silicon carbide. The silicon carbide substrate may be the first conductivity type and the drain contact may be provided on the silicon carbide substrate opposite the first layer of semiconductor material. The nitride-based semiconductor material may be a GaN based semiconductor material. An insulating layer may be provided between the gate contact and the barrier layer. Contact regions of semiconductor material of the first conductivity type may be provided between the source contact and the barrier layer. The trench may extend into the first layer. A third layer of semiconductor material of the first conductivity type may be disposed between the substrate and the first layer of semiconductor material.

DETAILED DESCRIPTION OF EMBODIMENTS OF THE INVENTION

Figure 1:
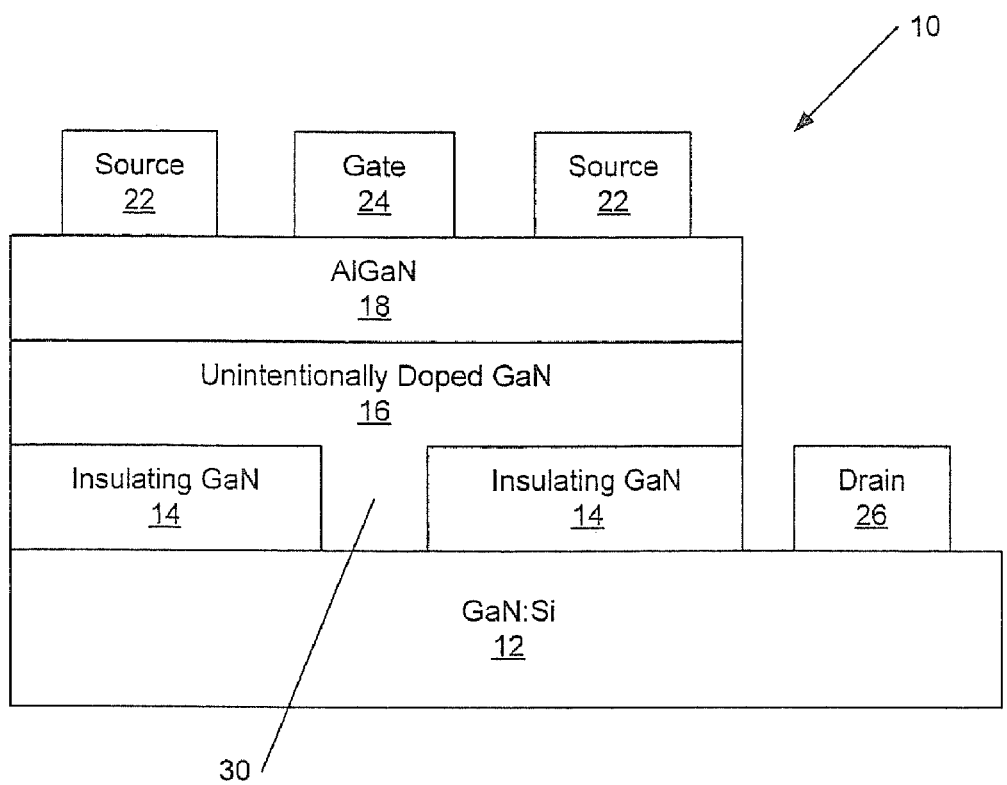
FIG. 1 is a schematic drawing of a conventional current aperture transistor.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a grown or deposited region illustrated as a rectangle will, typically, have rounded or curved features and/or a gradient of concentrations at its edges with another region rather than a binary change from a first region to a second region of different composition. Thus, the regions illustrated in the figures are schematic in nature and their shapes are not intended to illustrate the precise shape of a region of a device and are not intended to limit the scope of the present invention.

Some embodiments of the present invention provide vertical transistors that have a current aperture that is at least partially horizontal and methods of forming such transistors. In some embodiments of the present invention, the current aperture is laterally grown, for example, through lateral pendeo-epitaxial growth and/or through epitaxial lateral overgrowth (ELO). In some embodiments of the present invention, the use of lateral growth allows for the formation of a layer of semiconductor material having differing regions of conductivity types and/or differing conductivities as a result of the preferential incorporation of dopants in the laterally grown regions of the device. Such a single layer having differing lateral regions that are formed as part of a single growth or deposition process are referred to herein as a "hybrid layer." Hybrid layers may be distinguished from layers that have a substantially uniform conductivity type and/or conductivity in a lateral direction or layers that are formed of a substantially uniform conductivity type and/or conductivity that are subsequently processed by, for example, ion implantation and/or diffusion to alter the characteristics of a portion of the layer. Some embodiments of the present invention provide a transistor having at least a portion of the channel of the transistor provided by a hybrid layer.

Embodiments of the present invention may be suited for use in nitride-based vertical current aperture transistors, such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Figure 2:
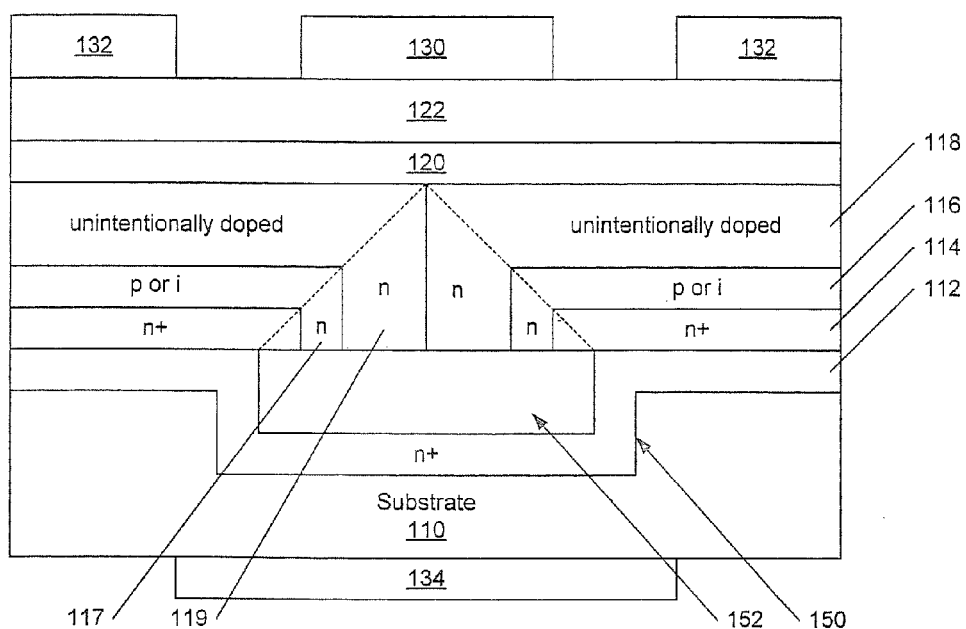
FIG. 2 is a schematic drawing of current aperture transistors according to some embodiments of the present invention.

FIG. 2 is a schematic cross sectional illustration of a current aperture transistor according to some embodiments of the present invention. As illustrated in FIG. 2, a substrate 110, such as a silicon carbide substrate, has a trench 150 formed therein. In some embodiments of the present invention, the trench may be from about 1 μm to about 20 μm deep and from about 0.5 μm to about 10 μm wide. As discussed below, the substrate 110 may be an n-type semiconductor material. The substrate 110 may be doped to provide a carrier concentration of from about $10^{17}$ to about $10^{20}$ cm$^{-3}$. Alternatively, the substrate 110 may be an insulating or semi-insulating substrate. In such a case, a contact may be provided to the n+ layer 112, for example, in a trench or at a peripheral edge of the device as illustrated in FIG. 1.

As is further illustrated in FIG. 2, a first layer 112 of n-type semiconductor material, such as a nitride-based semiconductor material, is provided on a surface of the substrate 110 and, in some embodiments, in the trench 150. The first layer 112 may, for example, be AlGaN and may be doped with, for example, Si, Ge and/or O to provide an n+ layer of AlGaN. In some embodiments of the present invention, the first layer 112 has a thickness of from about 0 (i.e. is an optional layer) to about 1 μm. The first layer 112 may also be doped to provide a carrier concentration of from about $10^{17}$ to about $10^{20}$ cm$^{-3}$. In some embodiments of the present invention where the substrate 110 is a GaN based substrate, such as a GaN substrate, the first layer 112 may be omitted.

A second layer 114 of n-type semiconductor material is provided on the first layer 112 (or the substrate if the first layer is omitted) and is cantilevered over the trench 150. The second layer 114 may, for example, be an n+ GaN layer and may be formed as discussed below, by pendeo-epitaxial growth. The second layer 114 is provided on a first surface of the first layer 112 that is opposite the substrate 110 and does not extend completely across the trench 150 but includes spaced apart regions that have opposing sidewalls. In some embodiments of the present invention, the second layer 114 has a thickness of from about 0.1 µm to about 5 µm. The second layer 114 also may be doped with an n-type dopant, such as Si, Ge and/or O, to provide a carrier concentration of from about $10^{17}$ to about $10^{20}$ cm$^{-3}$.

A third layer 116 of p-type and/or insulating semiconductor material is provided on the second layer 114 and has portions 117 of n-type semiconductor material that extend from the sidewalls of the second layer 114. Thus, the third layer 116 may be provided as a hybrid layer. The third layer 116 does not extend completely across the trench 150 but includes spaced apart regions that have opposing sidewalls. In some embodiments of the present invention, the third layer 116 may be p-type or insulating GaN formed as discussed below, by pendeo-epitaxial growth in the presence of an n-type dopant, such as Si, Ge and/or O, such that the portions 117 that are laterally grown are n-type GaN. The insulating and/or p-type regions of third layer 116 may substantially block current flow by, for example, having a Fermi level positioned at greater than about 0.5 eV from the conduction band. The portions 117 of the third layer 116 may be doped to provide a carrier concentration of, for example, from about $10^{14}$ to about $10^{19}$ cm$^{-3}$. The third layer 116 may have a thickness of from about 0.1 µm to about 10 µm.

As is further illustrated in FIG. 2, a fourth layer 118 of unintentionally doped semiconductor material is provided on the third layer 116. As discussed below, the unintentionally doped semiconductor material may be lightly doped. The fourth layer 118 has portions 119 of n-type semiconductor material that extend from the sidewalls of the third layer 116. Thus, the fourth layer 118 may be provided as a hybrid layer. In some embodiments, the fourth layer 118 extends completely across the trench 150 and may coalesce where the portions 119 extending from the sidewalls of the third layer 116 meet. Thus, a hole or opening 152 may be provided by the trench beneath the fourth layer 118. In some embodiments of the present invention, the fourth layer 118 may be primarily unintentionally doped GaN formed as discussed below, by pendeo-epitaxial growth in the presence of an n-type dopant, such as Si, Ge and/or O such that the portions 119 that are laterally grown are n-type GaN. The n-type dopants may be affirmatively supplied and/or may be unintentional, for example, the n-type may be provided as a by-product of a prior processing step and/or contamination. The unintentionally doped regions of the fourth layer 118 may be lightly n-type or have a low net concentration of acceptors or deep levels. The portions 119 of the fourth layer 118 may be doped to provide a carrier concentration of, for example, from about $10^{15}$ to about $10^{20}$ cm$^{-3}$. The fourth layer 118 may have a thickness of from about 0.1 µm to about 10 µm.

A channel layer 120 and a barrier layer 122 may be provided on the fourth layer 118. The channel layer 120 and the barrier layer 122 are configured so as to form a 2DEG near the interface between the channel layer 120 and the barrier layer 122. The channel layer 120 and/or the barrier layer 122 may be provided by a single or multiple layers. In some embodiments of the present invention, the channel layer 120 is an unintentionally doped GaN layer. The barrier layer 122 may be an AlGaN and/or AlN layer. In some embodiments of the present invention, the channel layer 120 is GaN having a thickness of from about 5 nm to about 5000 nm and the barrier layer 122 is AlGaN having a concentration of aluminum of from about 5% to about 100% and having a thickness of from about 1 nm to about 100 nm.

A gate contact 130 is provided on the barrier layer 122 and, in some embodiments, may be provided on an oxide (not shown) on the barrier layer 122. In some embodiments of the present invention, at least a portion of the gate contact 130 overlaps with the trench 150. In some embodiments of the present invention, the gate contact 130 is confined to a region above the trench 150. In still further embodiments, the gate contact 130 may be provided without overlap of the trench 150. The gate contact 130 may be formed of, for example, Ni/Au.

Optionally, a dielectric layer, such as a silicon nitride or silicon oxide layer is provided on the barrier layer 122. In such embodiments, the gate contact 130 may be formed in a recess in the dielectric layer or, in some embodiments, may be formed on the dielectric layer.

A source contact 132 is also provided on the barrier layer 122. Optionally, the source contact 132 may be provided on a recess into the barrier layer 122 and/or on a contact region so as to reduce resistance between the source contact 132 and the channel layer 120. The source contact 132 may be formed of, for example, Ti/Al/Ni/Au.

A drain contact 134 is provided on the substrate 110 opposite the first layer 112. Optionally, a backside implant or epitaxial layer (not shown) may be provided so as to reduce resistance between the drain contact 134 and the substrate 110. The backside implant or epitaxial layer may, for example, be an n+ region formed in or on the substrate 110 on which the drain contact 134 is provided. Furthermore, the substrate 110 may be thinned prior to formation of the drain contact 134. The drain contact may be formed of, for example, nickel if a silicon carbide substrate is used. As discussed above, the drain contact 134 may, optionally, be formed on the first layer 112, similar to the configuration illustrated in FIG. 1. In such embodiments of the present invention, an insulating substrate or a semi-insulating substrate, such as semi-insulating silicon carbide or sapphire, may be utilized for the substrate 110.

Without wishing to be bound by any theory of operation, electrons from the source contact 132 may flow along the 2DEG formed near the interface of the barrier layer 122 and the channel layer 120 and then vertically into the n-type portions 119 of the fourth layer 118 and then laterally across the n-type portion 117 of the third layer 116 to the n+ layer 114, vertically to the n+ layer 112 and to the drain contact 134 through the substrate 110. Thus, a current aperture may be provided by the p or i regions of the third layer 116 with a current path provided by the n-type regions incorporated in the laterally grown portions of the third layer 116 and the fourth layer 118. The hole 152 may also define the current aperture. Accordingly, a portion of the channel region of the device may be provided by a hybrid layer. Furthermore, the channel region through the current aperture may include a vertical portion through the fourth layer 118 and a horizontal portion through the third layer 116. The Schottky gate contact 130 (or MOS gate if an insulating layer provided on the barrier layer 122) may modulate the charge in the 2DEG to control the flow of current through the aperture.

Figure 3A:
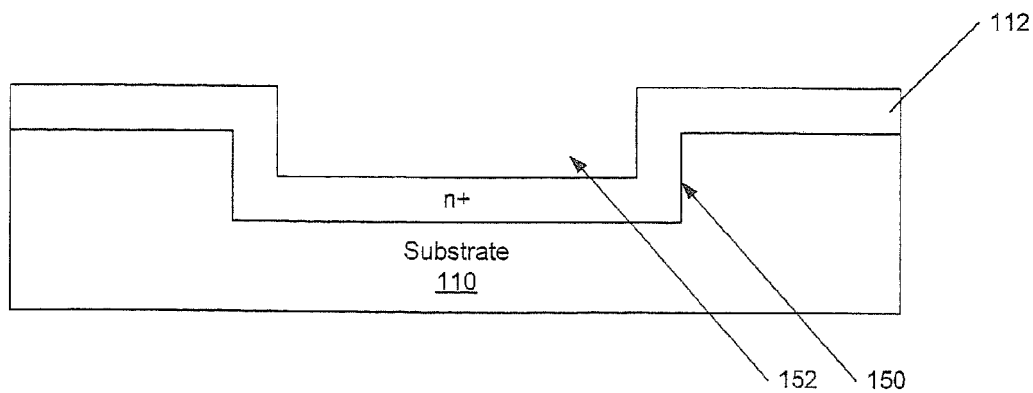
FIGS. 3A-3E are schematic drawings illustrating fabrication of current aperture transistors as illustrated in FIG. 2.

Fabrication of embodiments of the present invention as illustrated in FIG. 2 is schematically illustrated in FIGS. 3A-3E. As seen in FIG. 3A, a substrate 110 is provided on which nitride based devices may be formed. In particular embodiments of the present invention, the substrate 110 may be an n-type silicon carbide (SiC) substrate that may be, for example, 4H polytype of silicon carbide. Other silicon carbide candidate polytypes include the 3C, 6H, and 15R polytypes. Appropriate SiC substrates are manufactured by, for example, Cree, Inc., of Durham, N.C., the assignee of the present invention, and methods for producing are described, for example, in U.S. Pat. No. Re. 34,861; U.S. Pat. Nos.

4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

Optional buffer, nucleation and/or transition layers (not shown) may be provided on the substrate 110.

Although silicon carbide may be a preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed. In devices having an insulating or semi-insulating substrate, a second contact may be formed in a recess that extends to a drain layer opposite the current aperture from the gate.

As is further illustrated in FIG. 3A, a trench 150 is formed in the substrate 110, for example, by masking and etching the substrate 110. A dry etch, wet etch or other etch technique known to those of skill in the art may be utilized. The particular etch technique may depend on the substrate material. For example, in some embodiments of the present invention, a reactive ion etch may be utilized for a silicon carbide substrate. Other techniques for patterning the substrate to form a trench may also be utilized. For example, the trench could be provided by a saw cut or laser removal of material.

The first layer 112 is blanket formed on the substrate 110 including in the trench 150. The first layer 112 is formed conformally so as to maintain the opening 152 formed by the trench 150. The first layer 112 may be formed, for example, by plasma enhanced chemical vapor deposition (PECVD), metal organic chemical vapor deposition (MOCVD), molecular beam epitaxy (MBE), low pressure chemical vapor deposition (LPCVD) or other technique known to those of skill in the art. The particular deposition technique may depend on the composition of the first layer 112 and whether or not buffer layers such as those described above are utilized.

In some embodiments of the present invention, the first layer 112 may be omitted. For example, if the substrate 110 is a GaN substrate, the first layer 112 may be omitted and the trench may be formed in the GaN substrate.

Figure 3B:
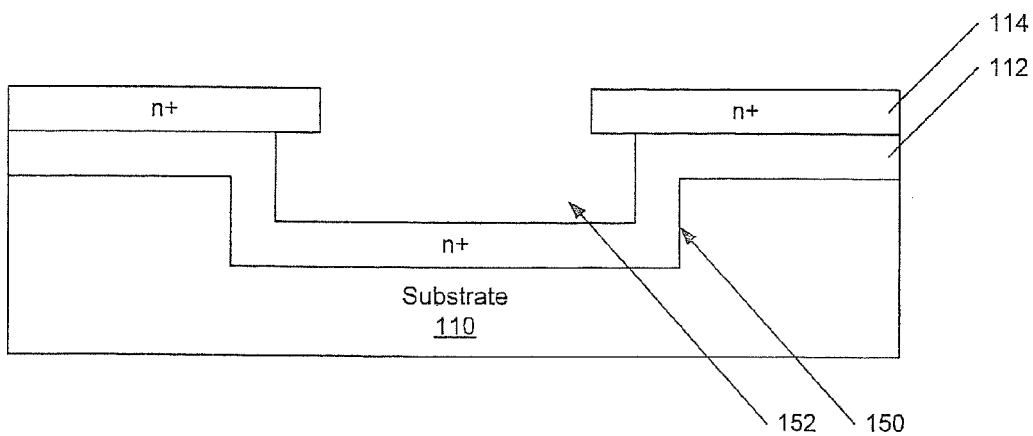

FIG. 3B illustrates formation of the second layer 114. The second layer 114 is formed by pendeo-epitaxial growth so as to be cantilevered over the opening 152 of the trench 150 and the first layer 112. Techniques for pendeo-epitaxial growth and/or epitaxial lateral overgrowth are known to those of skill in the art and need not be described further herein. However, examples of pendeo-epitaxial growth and/or epitaxial lateral overgrowth are described, for example, in U.S. Pat. Nos. 6,582,906, 6,706,114, 6,686,261, 6,621,148, 6,608,327, 6,602,764, 6,602,763, 6,586,778, 6,582,986, 6,570,192, 6,545,300, 6,521,514, 6,489,221, 6,486,042, 6,462,355, 6,380,108, 6,376,339, 6,261,929, 6,255,198, 6,177,688 and 6,051,849, the disclosures of which are incorporated herein by reference as if set forth fully herein. The particular conditions for formation of the second layer 114 may depend on the composition of the second layer 114. Furthermore, the growth may be oriented along different facets of the crystal structure so as to provide a higher degree of impurity incorporation. Such an orientation may be provided, for example, by the orientation of the trench 150 and/or the mask 425 described below and/or the growth conditions such as temperature, ratio of source materials (e.g. ratio of Group III to Group V sources) and/or growth pressure.

The second layer 114 may be grown in the presence of an n-type dopant, for example, for a GaN second layer 114, Si, Ge and/or O may be incorporated in the second layer 114 so as to provide an n+ second layer 114. During lateral growth of the second layer 114, the laterally grown portion may be more susceptible to incorporation of the dopant and, therefore, the laterally grown portions (illustrated by the dotted line in FIG. 2) may have a higher dopant concentration than the vertically grown portions of the second layer 114. Thus, while the second layer 114 is illustrated as an n+ layer, the dopant concentration and, accordingly, the carrier concentration, may differ in different regions of the second layer 114.

Figure 3C:
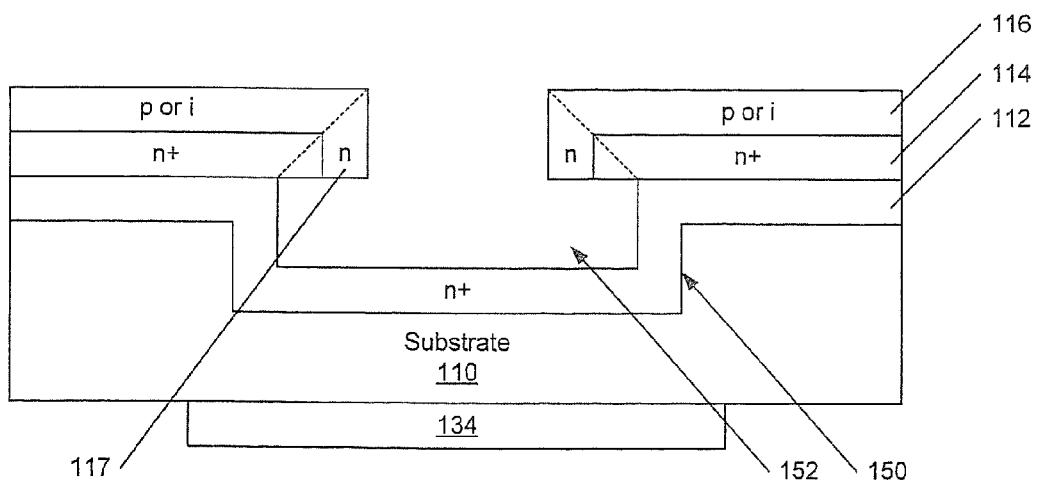

FIG. 3C illustrates the formation of the third layer 116. The third layer 116 is also cantilevered over the opening 152 of the trench 150. The third layer 116 may be formed by pendeo-epitaxial growth as described above. The third layer 116 is formed as insulating or p-type semiconductor material and may be formed in the presence of a small amount of n-type dopant, such as Si, by for example, including $SiH_4$ in the reaction chamber when the third layer 116 is grown. For a GaN based layer, a p-type dopant, such as Mg, Zn or Be, may be provided during formation of the third layer 116. An insulating GaN layer may be formed in the absence of a dopant other than that discussed herein with regard to the n-type laterally grown region of the third layer 116 and/or in the presence of a compensating dopant, such as Fe. The quantity of n-type dopant provided may depend on the composition of the third layer 116. However, the quantity should be sufficiently small so that the vertically grown portions of the third layer 116 are provided as p-type or insulating despite the presence of the n-type dopant (e.g. the p-type dopant or compensating dopant swamps the n-type dopant absent the preferential incorporation of n-type dopant provided by lateral growth) but sufficiently large so that the preferential incorporation of the n-type dopant in the laterally grown portions of the third layer 116 provide n-type regions.

Figure 3D:
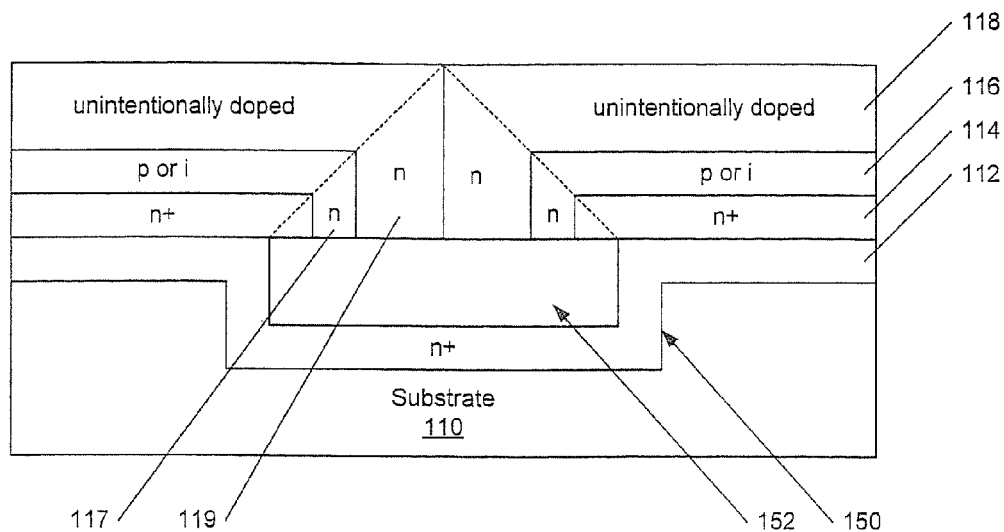

FIG. 3D illustrates formation of the fourth layer 118. The fourth layer is formed by pendeo-epitaxial growth as discussed above and may be grown to cover the opening 152 of the trench 150. Portions of the fourth layer 118 may be laterally grown to coalesce over the trench 150. The fourth layer 118 is formed as an unintentionally doped layer and may be formed in the presence of a small amount of n-type dopant, such as Si, by for example, including $SiH_4$ in the reaction chamber when the fourth layer 118 is grown. The quantity of n-type dopant provided may depend on the composition of the fourth layer 118. However, the quantity should be sufficiently small so that the vertically grown portions of the fourth layer 118 incorporate only an insubstantial amount of the n-type dopant and, thus, may be considered unintentionally doped. The quantity of n-type dopant should, however, be sufficiently large so that the preferential incorporation of the n-type dopant in the laterally grown portions of the fourth layer 118 provides n-type regions.

Figure 3E:
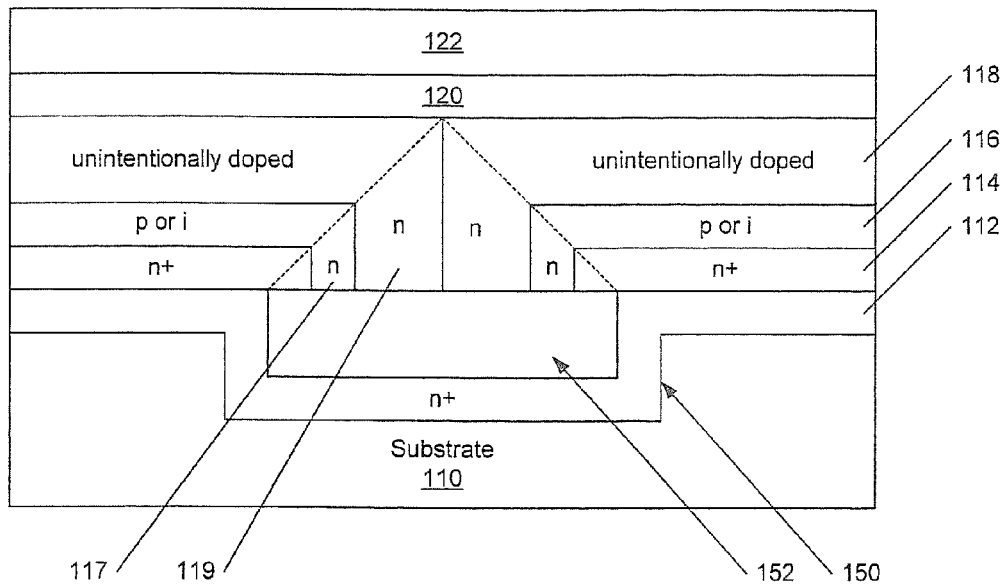

FIG. 3E illustrates formation of the channel layer 120 and the barrier layer 122. Such layers may be formed by conventional fabrication techniques based on the composition of the respective layers. A drain contact 134, a source contact 132 and a gate contact 130 may be formed on the barrier layer utilizing conventional techniques as illustrated in FIG. 2. In some embodiments of the present invention, the gate contact may be formed on a dielectric layer (not shown) on the barrier layer 122.

Figure 4:
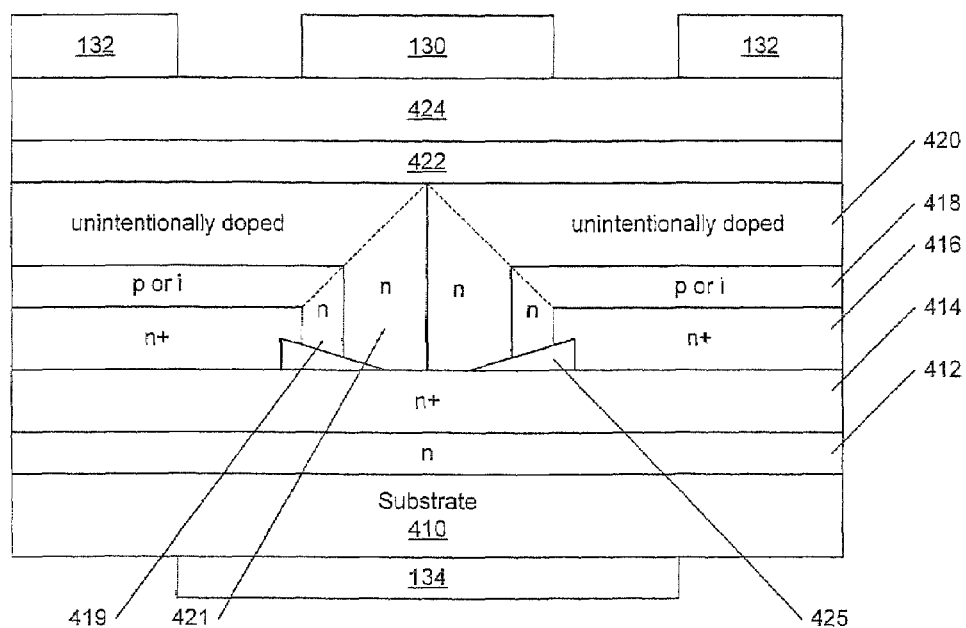
FIG. 4 is a schematic drawing of current aperture transistors according to further embodiments of the present invention.

FIG. 4 illustrates a transistor according to further embodiments of the present invention. As seen in FIG. 4, a first layer 412 of n-type semiconductor material is provided on a substrate 410, such as an n-type semiconductor material substrate. The substrate 410 may be a silicon carbide substrate as described above with reference to the substrate 110. The substrate 410 may be doped to provide a carrier concentration of from about $10^{17}$ to about $10^{20}$ cm$^{-3}$. Alternatively, the substrate 410 may be an insulating or semi-insulating substrate. In such a case, a contact may be provided to the n+ layer 414, for example, in a trench or at a peripheral edge of the device as illustrated in FIG. 1.

As is further illustrated in FIG. 4, a first layer 412 of n-type semiconductor material, such as a nitride-based semiconductor material, is provided on a surface of the substrate 410. The first layer 412 may, for example, may be AlGaN and may be doped with, for example, Si to provide an n-type layer of AlGaN. In some embodiments of the present invention, the first layer 412 has a thickness of from about 0 (i.e. is optional) to about 1 μm. The first layer 412 may also be doped to provide a carrier concentration of from about $10^{17}$ to about $10^{20}$ cm$^{-3}$.

A second layer 414 of n-type semiconductor material is provided on the first layer 412. The second layer 414 may, for example, be an n+ GaN layer. The second layer 414 is provided on a first surface of the first layer 412 that is opposite the substrate 410. In some embodiments of the present invention, the second layer 414 has a thickness of from about 0.1 μm to about 10 μm. The second layer 414 also may be doped to provide a carrier concentration of from about $10^{17}$ to about $10^{20}$ cm$^{-3}$.

Mask regions 425 are formed on the second layer 414. The mask regions correspond to a region of the current aperture and, in some embodiments, may be provided sufficiently thin such that during the growth of the subsequent layers, the center is etched away leaving an interior opening. The mask regions 425 may suppress vertical growth from the second layer 414. The mask regions 425 may be, for example, an oxide such as silicon dioxide.

In some embodiments of the present invention, the first layer 412 and/or second layer 414 may be omitted. For example, if the substrate 410 is a GaN substrate, the first layer 412 and/or the second layer 414 may be omitted and the mask 425 may be provided on the substrate 410.

A third layer 416 of n+ semiconductor material is provided on the second layer 414 and laterally overgrows at least a portion of the mask regions 425. The third layer 416 does not completely cover the mask regions 425 and has spaced apart sidewalls. In some embodiments of the present invention, the third layer 416 may be n-type GaN formed as discussed above using epitaxial lateral overgrowth. The third layer 416 may be doped to provide a carrier concentration of, for example, from about $10^{17}$ to about $10^{20}$ cm$^{-3}$. The third layer 416 may have a thickness of from about 0.1 μm to about 10 μm.

A fourth layer 418 of p-type or insulating semiconductor material is provided on the third layer 416 and at least a portion of the mask regions 425 and has portions 419 of n-type semiconductor material that extend from the sidewalls of the third layer 416. Thus, the fourth layer 418 may be provided as a hybrid layer. The fourth layer 418 does not extend completely across the mask regions 425 but includes spaced apart regions that have opposing sidewalls. In some embodiments of the present invention, the fourth layer 418 may be p-type or insulating GaN formed as discussed above, by epitaxial lateral overgrowth in the presence of an n-type dopant, such as Si, Ge or O, such that the portions 419 that are laterally grown are n-type GaN. The insulating and/or p-type regions of fourth layer 418 may substantially block current flow by, for example, having a Fermi level positioned at greater than about 0.5 eV from the conduction band. The portions 419 of the fourth layer 418 may be doped to provide a carrier concentration of, for example, from about $10^{14}$ to about $10^{19}$ cm$^{-3}$. The fourth layer 418 may have a thickness of from about 0.1 μm to about 10 μm.

As is further illustrated in FIG. 4, a fifth layer 420 of unintentionally doped semiconductor material is provided on the fourth layer 418. The fifth layer 420 has portions 421 of n-type semiconductor material that extend from the sidewalls of the fourth layer 418. Thus, the fifth layer 420 may be provided as a hybrid layer. In some embodiments, the fifth layer 420 extends completely between the sidewalls of the fourth layer 418 and may coalesce where portions extending from the sidewalls of the fourth layer 418 meet. In some embodiments of the present invention, the fifth layer 420 may be primarily unintentionally doped GaN formed as discussed elsewhere herein, by epitaxial lateral overgrowth in the presence of an n-type dopant, such as Si such that the portions 421 that are laterally grown are n-type GaN. The unintentionally doped regions of the fifth layer 420 may be lightly n-type or have a low net concentration of acceptors or deep levels. The portions 421 of the fifth layer 420 may be doped to provide a carrier concentration of, for example, from about $10^{15}$ to about $10^{20}$ cm$^{-3}$. The fifth layer 420 may have a thickness of from about 0.1 μm to about 10 μm.

A channel layer 422 and a barrier layer 424 may be provided on the fifth layer 420. The channel layer 422 and the barrier layer 424 are configured so as to form a 2DEG near the interface between the channel layer 422 and the barrier layer 424. The channel layer 422 and/or the barrier layer 424 may be provided by a single or multiple layers. In some embodiments of the present invention, the channel layer 422 is an unintentionally doped GaN layer. The barrier layer 424 may be an AlGaN and/or AlN layer. In some embodiments of the present invention, the channel layer 422 is GaN having a thickness of from about 5 nm to about 5000 nm and the barrier layer 424 is AlGaN having a concentration of aluminum of from about 5% to about 100% and having a thickness of from about 1 to about 10 nm.

A gate contact 130 is provided on the barrier layer 424 and, in some embodiments, may be provided on an oxide (not shown) on the barrier layer 424. In some embodiments of the present invention, at least a portion of the gate contact 130 overlaps with the region above the mask regions 425. In some embodiments of the present invention, the gate contact 130 is confined to a region above the mask 425 and circumscribed by the mask 425. In still further embodiments, the gate contact 130 may be provided without overlap of the mask 425. The gate contact 130 may be formed of, for example, Ni/Au.

Optionally, a dielectric layer, such as a silicon nitride or silicon oxide layer is provided on the barrier layer 424. In such embodiments, the gate contact 130 may be formed in a recess in the dielectric layer or, in some embodiments, may be formed on the dielectric layer.

A source contact 132 is also provided on the barrier layer 424. Optionally, the source contact 132 may be provided on a recess in to the barrier layer 424 and/or on a contact region so as to reduce resistance between the source contact 132 and the channel layer 120. The source contact 132 may be formed of, for example, Ti/Al/Ni/Au.

A drain contact 134 is provided on the substrate 410 opposite the first layer 412. Optionally, a backside implant or epitaxial layer (not shown) may be provided so as to reduce resistance between the drain contact 134 and the substrate 410. The backside implant or epitaxial layer may, for example, be an n+ region formed in or on the substrate 410 on which the drain contact 134 is provided. Furthermore, the substrate 410 may be thinned prior to formation of the drain contact 134. The drain contact may be formed of, for example, nickel, if a silicon carbide substrate is used. As discussed above, the drain contact 134 may, optionally, be formed on the first layer 412, similar to the configuration illustrated in FIG. 1. In such embodiments of the present invention, an insulating substrate or a semi-insulating substrate, such as semi-insulating silicon carbide or sapphire, may be utilized for the substrate 410.

Without wishing to be bound by any theory of operation, electrons from the source contact 432 may flow along the 2DEG formed near the interface of the barrier layer 424 and the channel layer 422 and then vertically into the n-type portions 421 of the fifth layer 420 and then laterally across the n-type portion 419 of the fourth layer 418 to the n+ layer 416, vertically to the n+ layer 414 and the first layer 412 and to the drain contact 134 through the substrate 410. Thus, a current aperture may be provided by the p or i regions of the fourth layer 418 with a current path provided by the n-type regions incorporated in the laterally grown portions of the fourth layer 418 and the fifth layer 410. The current aperture may also be defined by the mask 425. Accordingly, a portion of the channel region of the device may be provided by a hybrid layer. Furthermore, the channel region through the current aperture may include a vertical portion through the fifth layer 420 and a horizontal portion through the fourth layer 418. Current may also flow through the opening in the mask 425 is such opening is provided. The Schottky gate contact 130 (or MOS gate if an insulating layer provided on the barrier layer 424) may modulate the charge in the 2DEG to control the flow of current through the aperture.

Figure 5A:
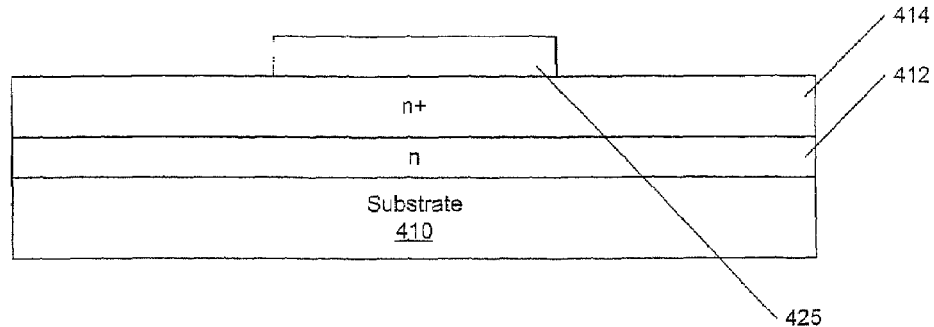
FIGS. 5A-5E are schematic drawings illustrating fabrication of current aperture transistors as illustrated in FIG. 4.

Fabrication of embodiments of the present invention as illustrated in FIG. 4 is schematically illustrated in FIGS. 5A-5E. As seen in FIG. 5A, a substrate 410 is provided on which nitride based devices may be formed. Fabrication of the substrate 410 may be provided as discussed above with reference to the substrate 110.

The first layer 412 and the second layer 414 are sequentially formed on the substrate 410. The first layer 412 and/or second layer 414 may be formed, for example, by plasma enhanced chemical vapor deposition (PECVD), metal organic chemical vapor deposition (MOCVD), molecular beam epitaxy (MBE), low pressure chemical vapor deposition (LPCVD) or other technique known to those of skill in the art. The particular deposition technique may depend on the composition of the first layer 412 and/or the second layer 414.

FIG. 5A further illustrates formation of the mask region 425. The mask region 425 may, for example, be fabricated by depositing an oxide layer onto the second layer 414 and then selectively etching the deposited oxide layer, for example, using a subsequent etch mask, to provide the mask region 425. Alternatively or additionally, a mask could be formed on the second layer 414 and the oxide layer selectively deposited in openings in the mask. Variable thickness of the mask regions 425 may result from etching of the mask during subsequent growth operations as a result of the high growth temperatures. In some embodiments of the present invention, the mask has a thickness such that an opening at the interior of the mask results from this etching. In other embodiments of the present invention, the thickness is such that a portion of the mask remains and no opening is formed.

Figure 5B:
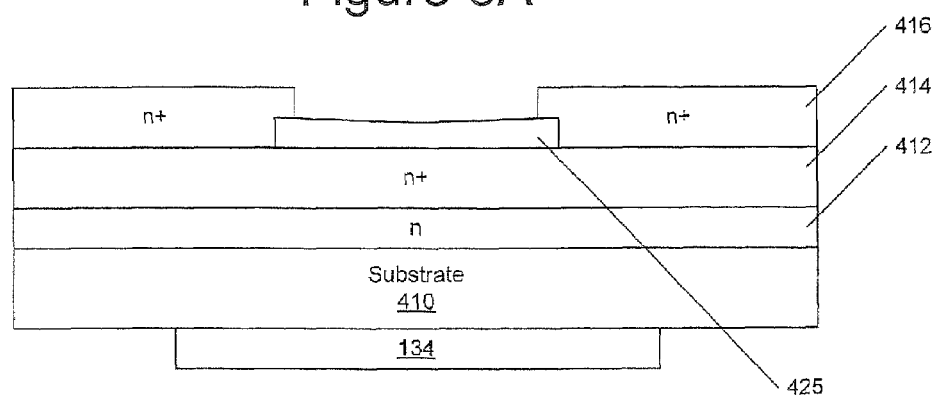

FIG. 5B illustrates formation of the third layer 416. The third layer 416 is formed by epitaxial lateral overgrowth so as to extend partly over the mask region 425 and on the second layer 414. Techniques for epitaxial lateral overgrowth are known to those of skill in the art and are described above. The particular conditions for formation of the third layer 416 may depend on the composition of the third layer 416. As is further seen in FIG. 5B, the mask region 425 may be partially etched by the high temperature growth of the third layer 416. Thus, the mask region 425 may have a tapered structure as the portions of the mask region 425 where no growth has occurred will be exposed and, therefore, etched for a longer period of time. Accordingly, in some embodiments of the present invention, the growth of the third layer 416 is carried out at a temperature sufficient to etch the mask region 425.

The third layer 416 may be grown in the presence of an n-type dopant, for example, for a GaN third layer 416, Si, Ge or O may be incorporated in the third layer 416 so as to provide an n+ third layer 416. During lateral growth of the third layer 416, the laterally grown portion may be more susceptible to incorporation of dopant and, therefore, the laterally grown portions (illustrated by the dotted line in FIG. 4) may have a higher dopant concentration than the vertically grown portions of the third layer 416. Thus, while the third layer 416 is illustrated as an n+ layer, the dopant and accordingly the carrier concentration, may differ in different regions of the second layer 416.

Figure 5C:
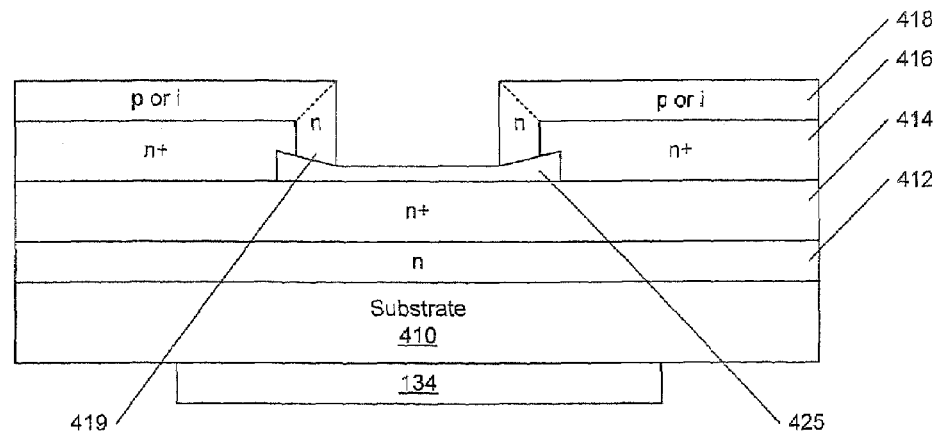

FIG. 5C illustrates the formation of the fourth layer 418. The fourth layer 418 also extends over a portion of the mask region 425. The fourth layer 418 may be formed by epitaxial lateral overgrowth as described above. The fourth layer 418 is formed as insulating or p-type semiconductor material and may be formed in the presence of a small amount of n-type dopant, such as Si, by for example, including $SiH_4$ in the reaction chamber when the fourth layer 418 is grown. For a GaN based layer, a p-type dopant, such as Mg, Zn or Be, may be provided during formation of the fourth layer 418. An insulating GaN layer may be formed in the absence of a dopant other than that discussed herein with regard to the n-type laterally grown region of the fourth layer 418 and/or in the presence of a compensating dopant, such as Fe. The quantity of n-type dopant provided may depend on the composition of the fourth layer 418. However, the quantity should be sufficiently small so that the vertically grown portions of the fourth layer 418 are provided as p-type or insulating despite the presence of the n-type dopant (e.g. the p-type dopant or compensating dopant swamps the n-type dopant absent the preferential incorporation of n-type dopant provided by lateral growth) but sufficiently large so that the preferential incorporation of the n-type dopant in the laterally grown portions 419 of the fourth layer 418 results in n-type regions.

As is further seen in FIG. 5C, the mask region 425 may be further etched by the high temperature growth of the fourth layer 418. Thus, the mask region 425 may have a tapered structure as the portions of the mask region 425 where no growth has occurred will be exposed and, therefore, etched for a longer period of time. Accordingly, in some embodiments of the present invention, the growth of the fourth layer 418 is carried out at a temperature sufficient to etch the mask region 425.

Figure 5D:
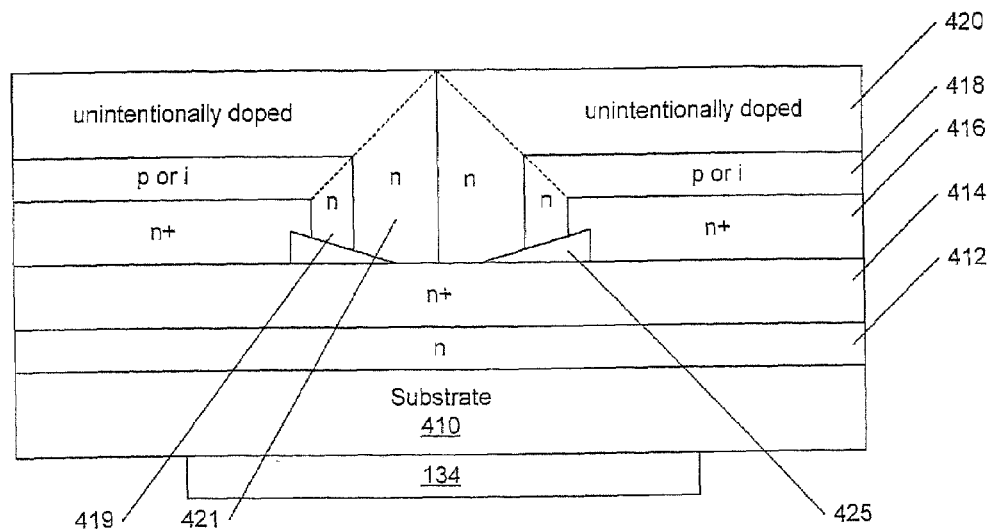

FIG. 5D illustrates formation of the fifth layer 420. The fifth layer 420 is formed by epitaxial lateral overgrowth as discussed above and may be grown to cover the mask region 425 and the region between the mask regions 425. Portions of the fifth layer 420 may be laterally grown to coalesce. The fifth layer 420 is formed as an unintentionally doped layer and may be formed in the presence of a small amount of n-type dopant, such as Si, by for example, including $SiH_4$ in the reaction chamber when the fifth layer 420 is grown. The quantity of n-type dopant provided may depend on the composition of the fifth layer 420. However, the quantity should be sufficiently small so that the vertically grown portions of the fifth layer 420 incorporate only an insubstantial amount of the n-type dopant and, thus, may be considered unintentionally doped. The quantity of n-type dopant should, however, be sufficiently large so that the preferential incorporation of the n-type dopant in the laterally grown portions 421 of the fifth layer 420 results in n-type regions.

As is further seen in FIG. 5D, the mask region 425 may be partially etched by the high temperature growth of the fifth layer 420. In some embodiments, the mask region 425 may be completely etched through in an interior portion. Thus, the mask region 425 may have a tapered structure as the portions of the mask region 425 where no growth has occurred will be exposed and, therefore, etched for a longer period of time. Accordingly, in some embodiments of the present invention, the growth of the fifth layer 420 is carried out at a temperature sufficient to etch the mask region 425.

Figure 5E:
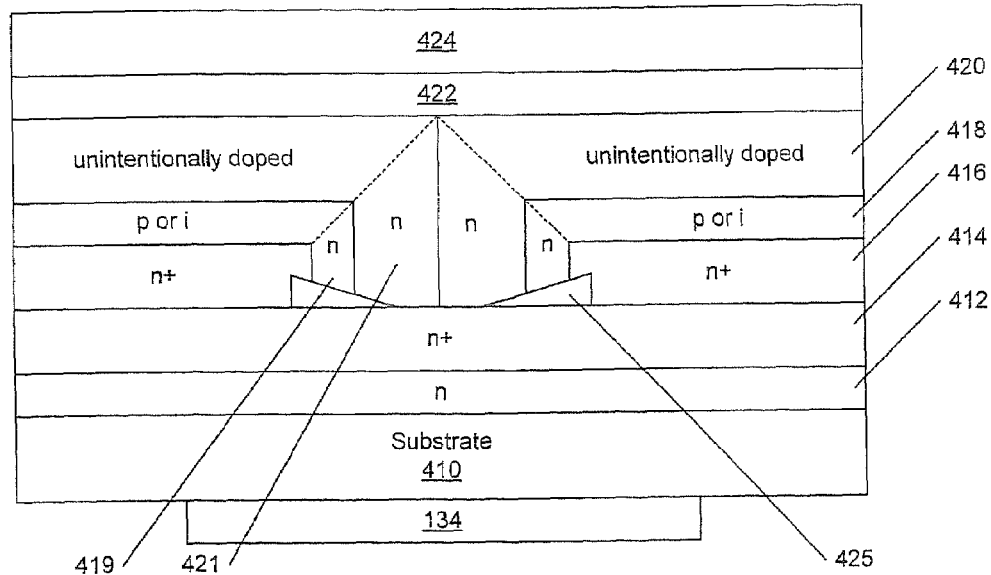

FIG. 5E illustrates formation of the channel layer 422 and the barrier layer 424. Such layers may be formed by conventional fabrication techniques based on the composition of the respective layers. A drain contact 134, a source contact 132 and a gate contact 130 may be formed utilizing conventional techniques as illustrated in FIG. 4. In some embodiments of the present invention, the gate contact may be formed on a dielectric layer (not shown) on the barrier layer 424.

Depending on the particular composition of the layers/regions and/or contacts illustrated in FIGS. 2, 3A-3E, 4 and/or 5A-5E, an anneal or multiple anneals may be carried out to activate dopants and/or anneal contacts. Such annealing techniques are known to those of skill in the art and, therefore, need not be described further herein.

Figure 6:
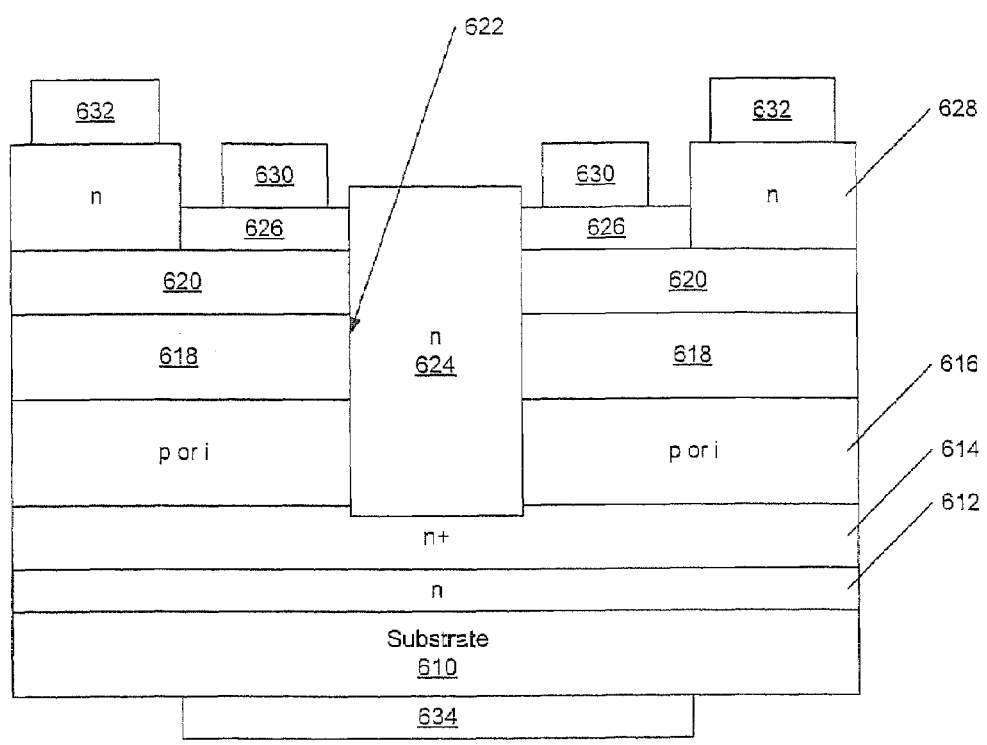
FIG. 6 is a schematic drawing illustrating a current aperture transistor according to further embodiments of the present invention.

FIG. 6 illustrates a transistor according to further embodiments of the present invention. In FIG. 6, the layer structure of the transistor may be formed and a trench subsequently formed through the layer structure and filled with n-type semiconductor material to provide the current aperture. As seen in FIG. 6, a first layer 612 of n-type semiconductor material is provided on a substrate 610, such as an n-type semiconductor material substrate. The substrate 610 may be a silicon carbide substrate as described above with reference to the substrate 110. The substrate 610 may be doped to provide a carrier concentration of from about $10^{17}$ to about $10^{20}$ cm$^{-3}$. Alternatively, the substrate 610 may be an insulating or semi-insulating substrate. In such a case, a contact may be provided to the n+ layer 614, for example, in a trench or at a peripheral edge of the device as illustrated in FIG. 1. In such embodiments, the first layer 612 may be omitted or provided as a buffer layer.

As is further illustrated in FIG. 6, a first layer 612 of n-type semiconductor material, such as a nitride-based semiconductor material, is provided on a surface of the substrate 610. The first layer 612 may, for example, may be AlGaN and may be doped with, for example, Si to provide an n-type layer of AlGaN. In some embodiments of the present invention, the first layer 612 has a thickness of from about 0 (i.e. the first layer is optional) to about 1 µm. The first layer 612 may also be doped to provide a carrier concentration of from about $10^{17}$ to about $10^{20}$ cm$^{-3}$.

A second layer 614 of n-type semiconductor material is provided on the first layer 612. The second layer 614 may, for example, be an n+ GaN layer. The second layer 614 is provided on a first surface of the first layer 612 that is opposite the substrate 610. In some embodiments of the present invention, the second layer 614 has a thickness of from about 0.1 µm to about 10 µm. The second layer 614 also may be doped to provide a carrier concentration of from about $10^{17}$ to about $10^{20}$ cm$^{-3}$.

A third layer 616 of p-type or insulating semiconductor material is provided on the second layer 614. In some embodiments of the present invention, the third layer 616 may be p-type or insulating GaN formed as discussed above. The insulating and/or p-type regions of third layer 616 may substantially block current flow by, for example, having a Fermi level positioned at greater than about 0.5 eV from the conduction band. The third layer 616 may have a thickness of from about 0.1 µm to about 10 µm.

A channel layer 618 and a barrier layer 620 may be provided on the third layer 616. The channel layer 618 and the barrier layer 620 are configured so as to form a 2DEG near the interface between the channel layer 618 and the barrier layer 620. The channel layer 618 and/or the barrier layer 620 may be provided by a single or multiple layers. In some embodiments of the present invention, the channel layer 618 is an unintentionally doped GaN layer. The barrier layer 620 may be an AlGaN and/or AlN layer. In some embodiments of the present invention, the channel layer 618 is GaN having a thickness of from about 5 nm to about 5 µm and the barrier layer 620 is AlGaN having a concentration of aluminum of from about 5% to about 100% and having a thickness of from about 1 nm to about 100 nm.

Optionally, a dielectric layer 626, such as a silicon nitride or silicon oxide layer is provided on the barrier layer 620. A trench 622 is formed through the dielectric layer 626, the barrier layer 620, the channel layer 618 and the third layer 616 and extends to, and in some embodiments, into the second layer 614. A region of n-type semiconductor material 624, such as a nitride-based semiconductor material, such as GaN, is provided in the trench 622.

In some embodiments of the present invention, the first layer 612 and/or second layer 614 may be omitted. For example, if the substrate 610 is a GaN substrate, the first layer 612 and/or the second layer 614 may be omitted and the trench 622 may be provided to extend to and/or into the substrate 610.

A gate contact 630 is provided on the dielectric layer 626 and, in some embodiments, may be provided directly on the barrier layer 620. The gate contact may be adjacent and spaced apart from the trench 622. The gate contact 630 may be formed of, for example, Ni/Au.

Source contact regions 628 may be provided of n-type semiconductor material, such as a nitride-based semiconductor material including, for example, GaN. The source contact regions 628 extend through the dielectric layer 626 to the barrier layer 620. A source contact 632 is also provided on the barrier layer 620. Optionally, the source contact 632 may be provided on a recess in the barrier layer 620. The source contact 632 may be formed of, for example, Ti/Al/Ni/Au.

A drain contact 634 is provided on the substrate 610 opposite the first layer 612. Optionally, a backside implant (not shown) may be provided so as to reduce resistance between the drain contact 634 and the substrate 610. The backside implant may, for example, be an n+ region formed in the substrate 610 on which the drain contact 634 is provided. Furthermore, the substrate 610 may be thinned prior to formation of the drain contact 634. The drain contact may be formed of, for example, nickel, for a silicon carbide substrate. As discussed above, the drain contact 634 may, optionally, be formed on the first layer 612 or the second layer 614, similar to the configuration illustrated in FIG. 1. In such embodiments of the present invention, an insulating substrate or a semi-insulating substrate, such as semi-insulating silicon carbide or sapphire, may be utilized for the substrate 610.

Without wishing to be bound by any theory of operation, electrons from the source contact 632 may flow from the n-type contact regions 628 along the 2DEG formed near the interface of the barrier layer 620 and the channel layer 618 and then into the n-type region 624 to the n+ layer 614 and the first layer 612 and to the drain contact 634 through the substrate 610. The gate contact 630 (or Schottky gate if an insulating layer is not provided on the barrier layer 620) may modulate the charge in the 2DEG to control the flow of current through the aperture.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A transistor comprising:
   a mask region on a substrate;
   a first epitaxial laterally overgrown layer comprising semiconductor material of a first conductivity type on the substrate and a portion of the mask region and having spaced apart sidewalls;
   a second epitaxial laterally overgrown layer comprising semiconductor material of a second conductivity type and/or insulating on the first epitaxial laterally overgrown layer comprising semiconductor material and a portion of the mask region and that includes spaced apart portions that extend from the spaced apart sidewalls of the first epitaxial laterally overgrown layer on the mask region, the spaced apart portions having the first conductivity type;
   a third epitaxial laterally overgrown layer comprising unintentionally doped semiconductor material on the second epitaxial laterally overgrown layer and that includes portions that extend from the spaced apart portions and coalesce and are the first conductivity type;
   a channel layer comprising semiconductor material on the third epitaxial laterally overgrown layer;
   a barrier layer on the channel layer;
   a source contact on the barrier layer;
   a gate contact on the barrier layer; and
   a drain contact electrically connected to the first layer comprising semiconductor material.

2. The transistor of claim 1, further comprising a first layer comprising semiconductor material comprising the first conductivity type on the substrate and wherein the mask region is on the first layer and the first epitaxial laterally overgrown layer is provided on the first layer.

3. The transistor of claim 1, wherein the first conductivity type is n-type and the second conductivity type is p-type.

4. The transistor of claim 1, wherein the semiconductor material comprises a nitride-based semiconductor material.

5. The transistor of claim 4, wherein the substrate comprises gallium nitride.

6. The transistor of claim 4, wherein the substrate comprises silicon carbide.

7. The transistor of claim 6, wherein the silicon carbide substrate is the first conductivity type and wherein the drain contact is provided on the silicon carbide substrate.

8. The transistor of claim 4, wherein the nitride-based semiconductor material comprises a GaN based semiconductor material.

9. A method of fabricating a transistor comprising:
   forming a mask region on a substrate;
   forming a first epitaxial laterally overgrown layer comprising semiconductor material of a first conductivity type by epitaxial lateral overgrowth on the first layer comprising semiconductor material and a portion of the mask region and having spaced apart sidewalls;
   forming a second epitaxial laterally overgrown layer comprising semiconductor material of a second conductivity type and/or insulating by epitaxial lateral overgrowth on the first epitaxial laterally overgrown layer comprising semiconductor material and a portion of the mask region and that includes spaced apart portions that extend from the spaced apart sidewalls of the first epitaxial laterally overgrown layer on the mask region, the spaced apart portions having the first conductivity type;
   forming a third epitaxial laterally overgrown layer comprising unintentionally doped semiconductor material by epitaxial lateral overgrowth on the second epitaxial laterally overgrown layer and that includes portions that extend from the spaced apart portions and coalesce and are the first conductivity type;
   forming a channel layer comprising semiconductor material on the third epitaxial laterally overgrown layer;
   forming a barrier layer on the channel layer;
   forming a source contact on the barrier layer;
   forming a gate contact on the barrier layer; and
   forming a drain contact electrically connected to the first layer comprising semiconductor material.

10. The method of claim 9, further comprising forming a first layer comprising semiconductor material of a first conductivity type on the substrate, wherein forming a mask region comprises forming a mask region on the first layer and wherein forming a first epitaxial laterally overgrown layer comprises forming a first epitaxial laterally overgrown layer on the first layer.

11. The method of claim 9, wherein the first conductivity type is n-type and the second conductivity type is p-type.

12. The method of claim 9, wherein the semiconductor material comprises a nitride-based semiconductor material.

13. The method of claim 12, wherein the substrate comprises gallium nitride.

14. The method of claim 12, wherein the substrate comprises silicon carbide.

15. The method of claim 14, wherein the silicon carbide substrate is the first conductivity type and wherein forming the drain contact comprises forming the drain contact on the silicon carbide substrate.

16. The method of claim 12, wherein the nitride-based semiconductor material comprises a GaN based semiconductor material.

* * * * *